US011538908B2

(12) United States Patent
Donkers et al.

(10) Patent No.: US 11,538,908 B2
(45) Date of Patent: Dec. 27, 2022

(54) SEMICONDUCTOR DEVICE

(71) Applicant: Nexperia B.V., Nijmegen (NL)

(72) Inventors: Johannes Josephus Theodorus Marinus Donkers, Eindhoven (NL); Hans Broekman, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 14/668,154

(22) Filed: Mar. 25, 2015

(65) Prior Publication Data
US 2015/0295051 A1    Oct. 15, 2015

(30) Foreign Application Priority Data

Apr. 11, 2014   (EP) ..................................... 14164449

(51) Int. Cl.
*H01L 29/205*    (2006.01)
*H01L 29/20*    (2006.01)
(Continued)

(52) U.S. Cl.
CPC ........ *H01L 29/2003* (2013.01); *H01L 29/205* (2013.01); *H01L 29/42316* (2013.01);
(Continued)

(58) Field of Classification Search
CPC .............. H01L 29/2003; H01L 29/205; H01L 29/42316; H01L 29/452; H01L 29/66431;
(Continued)

(56) References Cited

U.S. PATENT DOCUMENTS 5,929,467 A * 7/1999 Kawai ............... H01L 21/28194
257/192
7,045,404 B2 * 5/2006 Sheppard .......... H01L 29/66462
257/E21.407
(Continued)

FOREIGN PATENT DOCUMENTS

EP    2 541 605 A1    1/2013
EP    2 793 265 A1    10/2014

OTHER PUBLICATIONS

Donkers, J. et al. "600V-900V GaN-on-Si Process Technology for Schottky Barrier Diodes and Power Switches Fabricated in a Standard Si-Production Fab", Digest of papers of the CS MANTECH Conf., New Orleans, Louisiana, USA, pp. 259-262 (May 2013).
(Continued)

*Primary Examiner* — Ori Nadav
(74) *Attorney, Agent, or Firm* — Ruggiero, McAllister & McMahon LLC

(57)    ABSTRACT

A semiconductor device (100, 100', 100") and a method for manufacturing a semiconductor device (100, 100', 100"). The semiconductor device (100, 100', 100") includes a substrate (104, 106), a GaN layer (112), and an AlGaN layer (114). The GaN layer (112) is located between the substrate (104, 106) and the AlGaN layer (114). The device further includes at least one contact (130, 132, 134), comprising a central portion (150) and an edge portion (152), and a passivation layer (160) located at least between the edge portion (152) of the contact (130, 132, 134) and the AlGaN layer (114). The edge portion (152) is spaced apart from an upper surface of the passivation layer (160). The edge portion (152) may be spaced apart from the passivation layer (160) by a further layer (170) or by an air gap (172).

15 Claims, 5 Drawing Sheets

(51) Int. Cl.
*H01L 29/66* (2006.01)
*H01L 29/423* (2006.01)
*H01L 29/778* (2006.01)
*H01L 29/45* (2006.01)

(52) U.S. Cl.
CPC .. *H01L 29/66431* (2013.01); *H01L 29/66462* (2013.01); *H01L 29/778* (2013.01); *H01L 29/7786* (2013.01); *H01L 29/452* (2013.01)

(58) Field of Classification Search
CPC ............. H01L 29/66462; H01L 29/778; H01L 29/7786
USPC .......................................................... 257/76
See application file for complete search history.

(56) References Cited

U.S. PATENT DOCUMENTS

| | | | | |
|---|---|---|---|---|
| 2006/0043416 | A1* | 3/2006 | P. Li | H01L 21/28593 257/192 |
| 2007/0018199 | A1* | 1/2007 | Sheppard | H01L 29/42316 257/200 |
| 2007/0164321 | A1* | 7/2007 | Sheppard | H01L 29/66462 257/256 |
| 2007/0164322 | A1* | 7/2007 | Smith | H01L 29/42312 257/256 |
| 2007/0267655 | A1* | 11/2007 | Endoh | H01L 29/66462 257/194 |
| 2008/0157121 | A1* | 7/2008 | Ohki | H01L 29/66462 257/194 |
| 2008/0203541 | A1* | 8/2008 | Makiyama | C23C 16/345 257/640 |
| 2009/0159930 | A1* | 6/2009 | Smorchkova | H01L 29/42316 257/194 |
| 2010/0184262 | A1* | 7/2010 | Smorchkova | H01L 29/42316 438/172 |
| 2010/0276698 | A1* | 11/2010 | Moore | H01L 21/0272 257/76 |
| 2010/0330754 | A1* | 12/2010 | Hebert | H01L 29/66462 438/172 |
| 2011/0049526 | A1* | 3/2011 | Chu | H01L 21/28587 257/76 |
| 2011/0127545 | A1* | 6/2011 | Makiyama | H01L 29/66431 257/77 |
| 2011/0241018 | A1* | 10/2011 | Korenstein | H01L 21/02389 257/76 |
| 2012/0126306 | A1* | 5/2012 | Kawaguchi | H01L 21/764 257/319 |
| 2013/0221364 | A1 | 8/2013 | Yu et al. | |
| 2013/0341679 | A1* | 12/2013 | Green | H01L 29/402 257/192 |
| 2014/0306232 | A1 | 10/2014 | Donkers et al. | |
| 2015/0325698 | A1 | 11/2015 | Donkers et al. | |

OTHER PUBLICATIONS

Palacios, T. et al. "50 nm AlGaN/GaN HEMT Technology for mm-wave Applications", Device Research Conference, 2006 64th, vol. No., pp. 99-100 (Jun. 2006).
Extended European Search Report for EP Patent Appln. No. 14164449.2 (dated Aug. 26, 2014).

* cited by examiner

SEMICONDUCTOR DEVICE

CROSS-REFERENCE TO RELATED APPLICATIONS

This application claims the priority under 35 U.S.C. § 119 of European patent application no. 14164449.2, filed on Apr. 11, 2014, the contents of which are incorporated by reference herein.

FIELD OF THE INVENTION

This invention relates to a semiconductor device, and relates particularly, but not exclusively, to a semiconductor device having an AlGaN layer on a GaN layer.

BACKGROUND OF THE INVENTION

In recent years, III-V materials such as GaN (gallium nitride) have drawn a lot of interest as promising materials for high-temperature and high-power electronics. Future high-efficiency power convertors require fast switching, low conduction-loss devices that can handle high voltages. GaN is a good candidate for voltages up to 1 kV and shows excellent switching behaviour in Schottky diodes and High Electron Mobility Transistors (HEMTs).

GaN HEMTs are typically fabricated by applying ohmic source and drain contacts and a Schottky gate contact on top of an epitaxially-grown structure including an AlGaN (aluminium gallium nitride) barrier layer on a GaN channel layer.

At the junction between the AlGaN and GaN layers, a strong piezoelectric polarization effect causes a very thin layer of highly-mobile conducting electrons with a very high concentration or density to form spontaneously in the GaN channel near to the AlGaN/GaN interface. This layer is known as a two dimensional electron gas (2DEG). The high mobility of the 2D electron gas gives this layer a low resistivity. This is exploited in devices such as HEMTs, which have a low resistivity compared with other types of field effect transistors (FETs). As with other types of FET, the conductivity of the 2D electron gas can be modified by applying a potential to the gate.

Applications of GaN HEMT devices include radiofrequency and microwave power amplifiers, high-voltage power converters and sensors.

Due to advances in GaN-on-Si epitaxy, the semiconductor industry is now actively combining III-V-specific device expertise with low cost, high volume, mainstream silicon production facilities. As the technology advances, more stringent demands will be made on the reproducibility, uniformity, thermal stability, and high-temperature operation of GaN-based electronic devices.

SUMMARY OF THE INVENTION

According to a first aspect of the invention, there is provided a semiconductor device, comprising:
 a substrate;
 a GaN layer;
 an AlGaN layer, wherein the GaN layer is located between the substrate and the AlGaN layer;
 at least one contact, comprising a central portion and an edge portion; and
 a passivation layer located at least between said edge portion of said contact and said AlGaN layer;
wherein said edge portion is spaced apart from an upper surface of said passivation layer.

The semiconductor device of the present invention is structurally different from known devices. This structural difference improves manufacturability of the device.

The semiconductor device of the present invention may be made using a fabrication process including a step of forming a further layer above the passivation layer prior to forming at least one contact of the device. The inclusion of this further layer during the fabrication process results in an edge portion of the contact being spaced apart from an upper surface of the passivation layer in the semiconductor device.

When using such a process, the further layer acts as a sacrificial layer and protects the passivation layer during the subsequent steps of the fabrication process, in particular the steps of forming the contacts. The presence of the further or sacrificial layer reduces passivation layer consumption during various etching processes, thereby reducing local variations in the thickness of the passivation layer, which in turn improves the uniformity of the reverse leakage current of devices fabricated on a single wafer. In addition, the reduction in consumption of the passivation layer enables the final thickness of the passivation layer to be reduced, thereby reducing the reverse leakage current. Furthermore, the presence of the further or sacrificial layer during various steps of the fabrication process reduces or avoids the introduction of charges in or close to the passivation layer, for example by plasma-induced carrier injection, thereby improving the dynamic behaviour of the device.

In one embodiment, said edge portion is spaced apart from said upper surface of said passivation layer by a further layer, said further layer being different from said passivation layer.

The further layer acts as a sacrificial layer, protecting the passivation layer during etching of the contact.

The passivation layer and the further layer may have different densities.

This feature can improve selective removal of the further layer from the passivation layer by, for example, an etch process.

The passivation layer may comprise silicon nitride, and the further layer may comprise silicon nitride having a different (for example, higher) proportion of silicon than said passivation layer.

This feature can also improve selective removal of the further layer from the passivation layer by, for example, an etch process.

The passivation layer may comprise LPCVD silicon nitride and the further layer may comprise PECVD silicon nitride.

Advantageously, PECVD silicon nitride can be selectively removed from LPCVD silicon nitride by wet etching, for example using a buffered oxide etch (BOE).

Alternatively, the passivation layer may comprise silicon nitride (for example PECVD silicon nitride or LPCVD silicon nitride) and the further layer may comprise PECVD silicon oxide.

These materials also provide the advantage that the further layer can be selectively removed from the passivation layer by certain etch processes.

In a further embodiment, the edge portion is spaced apart from said upper surface of said passivation layer by an air gap.

This feature may result from a further layer having been formed above the passivation layer prior to formation of the contact, and subsequently removed after formation of the contact. For example, the further layer may be removed by over-etching during patterning of the contact to ensure complete removal of metallization outside of the contact. The air gap provides good insulation of the contact in this region.

The contact may further comprise an intermediate portion between said central portion and said edge portion, wherein an upper surface of said passivation layer is in contact with said intermediate portion of said contact.

This feature may result from applying the further layer above the passivation layer prior to formation of the contact, and subsequently forming an opening for the contact such that a larger opening is formed in the further layer than in the passivation layer, thereby exposing a portion of the upper surface of the passivation layer. Subsequent deposition of the contact results in the intermediate portion of the contact being in contact with the upper surface of the passivation layer. Advantageously, this improves control over the thickness of the passivation layer around the foot of the contact where the metal of the contact is in contact with the AlGaN layer. This is particularly important for the Schottky gate contact of a HEMT, as the thickness of the passivation layer under the gate metal around the gate foot determines, for a large part, the electrical field shape and therefore the reverse leakage current of the resulting semiconductor device. Improving control of this thickness therefore reduces process spread in the reverse leakage current.

The separation between the upper surface of the passivation layer and the edge portion of the contact may decrease towards said intermediate portion.

This feature further improves control over the passivation layer thickness around the foot of the contact, since it reduces the contribution of the further layer to the overall thickness of the passivation layer close to the foot of the contact.

A thickness of said passivation layer may be less than 50 nanometres.

The present invention enables the thickness of the passivation layer to be reduced compared to that of known devices, thereby reducing the reverse leakage current of the device.

A thickness of said passivation layer may be around or less than 30 nanometres.

Said passivation layer may comprise an opening for electrical contact of the central portion of the contact with the AlGaN layer.

The device may further comprise a capping layer between said AlGaN layer and said passivation layer.

The semiconductor device may comprise a High Electron Mobility Transistor (HEMT) having a source, a gate, and a drain, wherein said contact comprises one of said source, said gate and said drain.

In one embodiment, said contact may comprise said gate.

In another embodiment, the semiconductor device may comprise a Schottky barrier diode having an anode and a cathode, wherein said contact comprises one of said anode and said cathode.

According to another aspect of the invention, there is provided a radiofrequency (rf) power device comprising a semiconductor device as defined above.

According to a further aspect of the invention, there is provided a method for manufacturing a semiconductor device, the method comprising:
 forming a GaN layer on a substrate;
 forming an AlGaN layer on said GaN layer;
 forming a passivation layer;
 forming a further layer on the passivation layer;
 forming an opening through said further layer and said passivation layer; and
 forming a contact in said opening, wherein said contact comprises a central portion and an edge portion, wherein said edge portion extends over a part of said further layer.

In one embodiment, said step of forming said opening through said further layer and said passivation layer comprises:
 forming a first opening in said further layer by a wet etch process; and
 forming a second opening in said passivation layer by a dry etch process.

Advantageously, this enables selective etching of the passivation layer and further layer and reduces exposure of the device to plasma etching which could otherwise result in plasma induced carrier injection into or close to the passivation layer.

In one embodiment, the method may further comprise removing at least a part of said further layer from under said edge portion.

BRIEF DESCRIPTION OF THE DRAWINGS

Preferred embodiments of the present invention will now be described, by way of example only and not in any limitative sense, with reference to the accompanying drawings, in which.

DETAILED DESCRIPTION OF EMBODIMENTS

Figure 1:
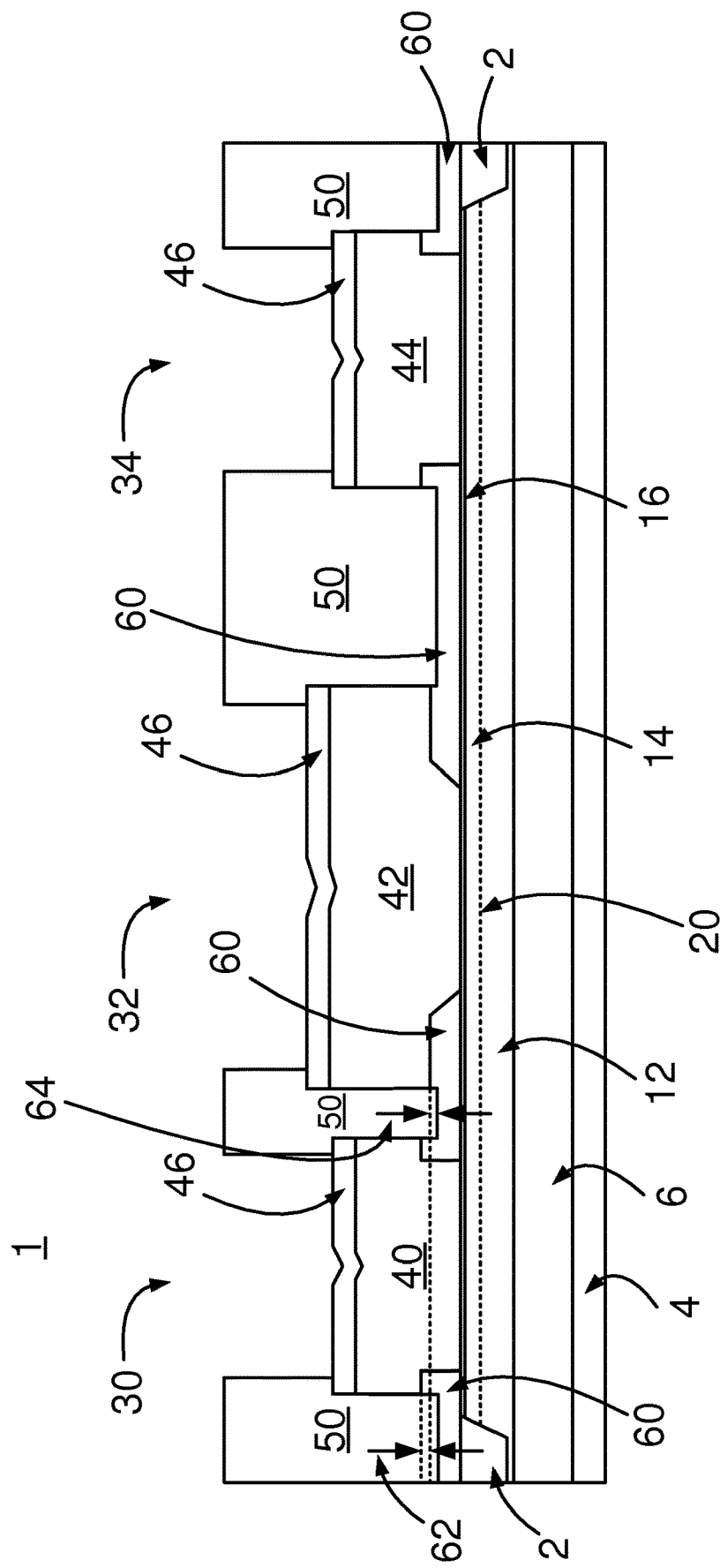
FIG. 1 shows a semiconductor device including an AlGaN layer on a GaN layer.

FIG. 1 shows a cross-section of a semiconductor device 1, in the form of a HEMT, useful for understanding the present invention. The semiconductor device 1 differs from semiconductor devices according to the present invention in that a further or sacrificial layer was not formed over the passivation layer prior to forming the contacts.

The semiconductor device 1 includes a substrate 4, 6 comprising an AlGaN layer 14 on a GaN layer 12. The AlGaN layer 14 is typically a 20 nm thick layer of AlGaN comprising around 20% Al. The substrate 4, 6 typically comprises an epitaxially-grown GaN-based buffer layer 6 on a silicon layer 4. A capping layer 16 is formed on the AlGaN layer 14, followed by a passivation layer 60. The capping layer 16 is typically a 3 nm thick layer of GaN. Isolation 2 is provided between adjacent semiconductor devices 100, for example by argon implantation to disrupt the crystal structure and thus the presence of a 2D electron gas.

Ohmic drain and source contacts 30, 34 and a Schottky gate contact 32 are provided on an upper surface of the device 1, as is known in the art. For example, the ohmic contacts 30, 34 may each comprise a titanium/aluminium stack 40, 44 and the Schottky contact 32 may comprise nickel. Each of the contacts 30, 32, 34 includes a contact capping layer 46 comprising a TiW/TiWN/TiW stack.

A 2D electron gas (2DEG), indicated by the dashed line 20, forms spontaneously in the GaN layer 12, near the interface between the GaN layer 12 and the AlGaN layer 14. The mobility of the electron gas 20 in the GaN layer 12 is relatively high, leading to a low resistance between the source 30 and drain 34. As is well known in the art, the channel resistance is determined by the electron gas 20 below the gate contact 32 and can, in use, be altered by the application of a potential at the gate contact 32.

A critical step in GaN device fabrication is the deposition of the first passivation layer 60. In this example, the passivation layer 60 comprises LPCVD (low pressure chemical vapour deposition) silicon nitride. The passivation layer 60 has a minimum thickness of around 50 nm and is typically between 50 nm and 100 nm thick.

To form the ohmic contacts 30, 34, windows are etched through the passivation layer 60 using a dry etch and metallization 40, 46 is applied via sputter deposition of Ti/Al/TiW(N), where TiW(N) indicates the TiW/TiWN/TiW stack 46. The metal stack 40, 46 is then patterned through a dry etch process involving a plasma etch to remove all the metal from the passivation layer 60 outside of the contacts 30, 34. Although the dry etch process is optimized to have a good selectivity to silicon nitride, over-etching is performed to ensure that all the metal is removed. The complete dry etch sequence causes a part of the silicon nitride passivation layer 60 to be consumed, typically 15-20 nanometers. This reduction in the thickness of the passivation layer 60 is indicated by the arrows 62 in FIG. 1.

Furthermore, the silicon nitride passivation layer 60 is exposed to dry etching again when the gate contact 32 is formed, again resulting in a consumption of 15-20 nanometers of the passivation layer 60. This second reduction in thickness of the passivation layer 60 is indicated by the arrows 64 in FIG. 1.

Since the two dry etch processes each consumes around 15-20 nm of the silicon nitride of the passivation layer 60, giving a total loss of around 40 nm, these etch processes together impose a practical limit on the minimum thickness of the passivation layer 60 prior to patterning the contacts 30, 32, 34. For example, given a total loss of around 40 nm due to the two etch processes, a minimum initial thickness of the silicon nitride passivation layer 60 might be around 50 nm.

As is usual in semiconductor fabrication techniques, a large number of semiconductor devices 1 are fabricated on a single wafer. During both dry etch process steps discussed above, the consumption of the silicon nitride passivation layer 60 is not completely uniform across the wafer, and can vary, in particular with the local pattern density. As the thickness of the passivation layer 60 directly affects the reverse leakage current of the semiconductor device 1, local thickness variations of the passivation layer 60 lead to variations in reverse leakage current of devices at different locations on the wafer.

Another problem arising in the device shown in FIG. 1 is that of dynamic behavior. Also known as "dynamic $R_{on}$," or "current collapse" in GaN devices, this problem is not yet fully understood. In GaN/AlGaN HEMTs, a current flows between the ohmic source and drain contacts 30, 34 via the 2D electron gas (2DEG) that is formed at the interface between the AlGaN layer 14 and GaN layer 12. The current is switched-off by applying a suitable voltage on the Schottky gate contact 32 such that the 2DEG under the gate contact 32 disappears. In one application, a HEMT is switched between an off-state, in which a high drain-to-source voltage is blocked while having a low leakage current, and an on-state in which a high current is produced at a low voltage. The design of such devices targets an optimum trade-off between power losses in the on-state, off-state and during switching. Both a HEMT and a Schottky diode suffer from the problem that the on-state resistance under dynamic conditions (e.g. switching, pulsed, RF) is significantly higher than under DC conditions. The problem originates in the charge balance of the device: charges are flowing along different interfaces in the device and trapping of these charges disturbs the charge balance. Therefore, any charge introduced in or close to the first passivation layer, for example during plasma etch processes, may impact the dynamic behavior of the semiconductor device.

With reference to FIGS. 2 to 6, embodiments of the present invention will now be described.

Figure 2:
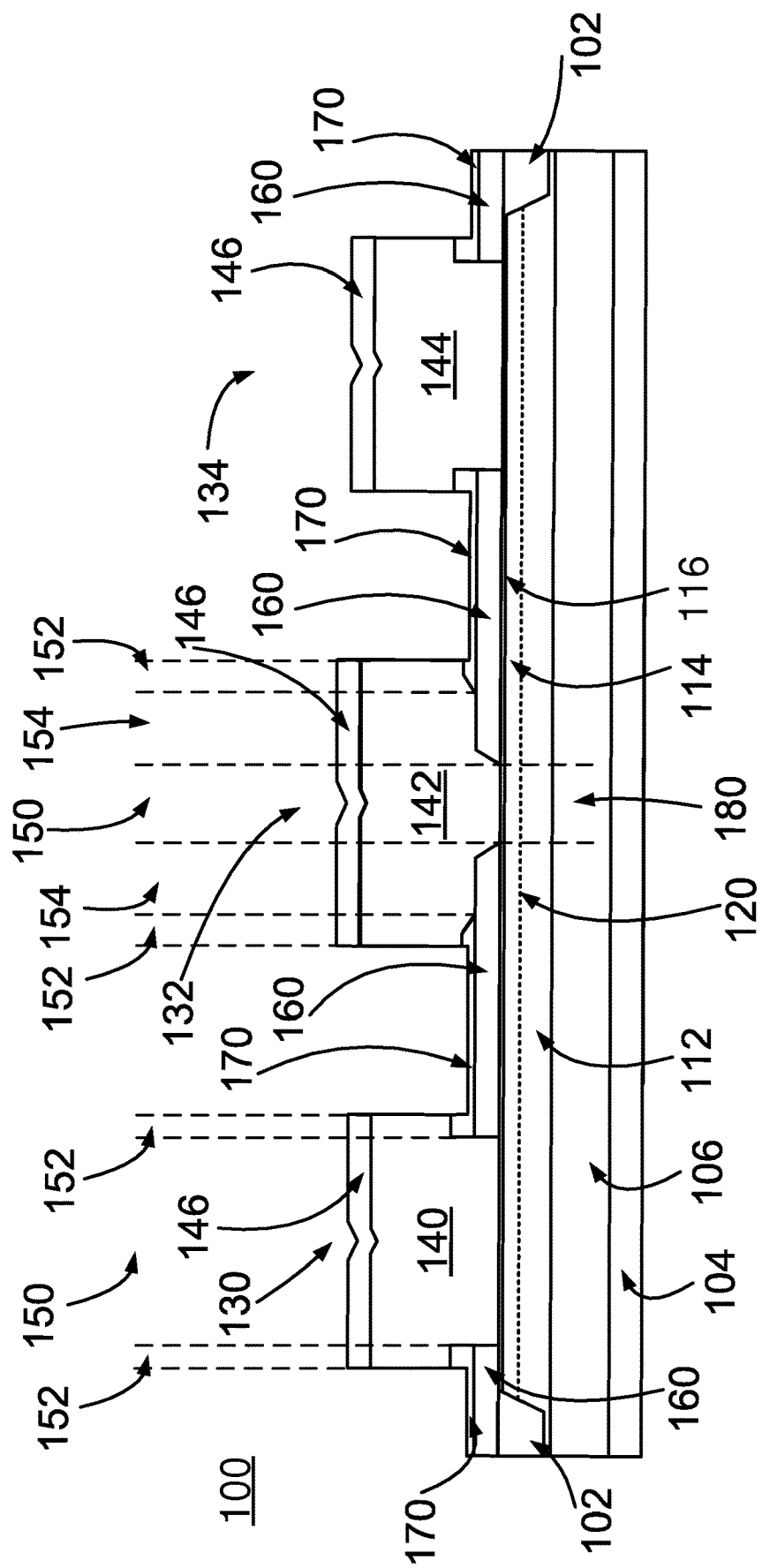
FIG. 2 shows a High Electron Mobility Transistor (HEMT) according to an embodiment of the invention.

FIG. 2 shows a cross-section of a semiconductor device 100, in the form of a High Mobility Electron Transistor (HEMT), according to a first embodiment of the invention. The semiconductor device 100 includes an AlGaN layer 114 on a GaN layer 112, epitaxially grown on a substrate 104, 106. The AlGaN layer 14 is typically a 20 nm thick layer of AlGaN comprising around 20% Al. The substrate 104, 106 typically comprises an epitaxially-grown GaN-based buffer layer 106 on a silicon layer 104. Isolation 102 is provided between adjacent semiconductor devices 100 for example by argon implantation to disrupt the crystal structure and thus the presence of a 2D electron gas.

A capping layer 116 is formed on the AlGaN layer 114 as is known in the art. The capping layer 116 may comprise, for example, a 3 nm thick layer of GaN. A passivation layer 160 is formed over the capping layer 116. Importantly, a sacrificial layer 170 is formed on the passivation layer 160.

Contacts 130, 132 and 134 are provided on an upper surface of the AlGaN layer 114. In this embodiment, the contacts 130 and 134 are ohmic contacts, comprising the source 130 and drain 134 respectively of the HEMT 100. The contact 132 is a Schottky contact comprising the gate of the HEMT. Each of the ohmic contacts 130, 134 comprises a titanium/aluminium stack 140, 144, while the metallisation 142 of the Schottky contact 132 comprises nickel. Each of the contacts 130, 132, 134 further comprises a contact capping layer 146 comprising a TiW/TiWN/TiW stack.

A 2D electron gas (2DEG), indicated by the dashed line 120, forms spontaneously in the GaN layer 112, near the interface between the GaN layer 112 and the AlGaN layer 114. The mobility of the electron gas 120 in the GaN layer 112 is relatively high, leading to a low resistance between the source 130 and drain 134. As is well known in the art, the channel resistance, determined by the electron gas below the gate contact 132 can, in use, be altered by the application of a potential to the gate contact 132.

Each contact 130, 132, 134 comprises a central portion 150 and an edge portion 152. The central portion 150 of each contact 130, 132, 134 penetrates a contact window of the passivation layer 160 to provide electrical contact with the AlGaN layer 114. A part of the passivation layer 160 is located at least between the edge portion 152 of each contact 130, 132, 134 and the AlGaN layer 114. Furthermore, an upper surface of the passivation layer 160 is spaced apart from the edge portion 152 of each contact 130, 132, 134. In this embodiment, the passivation layer 160 is spaced apart from each edge portion 152 by a part of the sacrificial layer 170. The Schottky contact 132 also comprises an intermediate portion 154 between the central portion 150 and the edge portion 152 of the Schottky contact 132. An upper surface of the passivation layer 160 is in contact with the intermediate portion 154 of the Schottky contact 142.

The purpose of the sacrificial layer 170 is to protect the passivation layer 160 during etching of the contacts 130, 132, 134 during the manufacturing process, an embodiment of which is described below.

The materials of the passivation layer 160 and sacrificial layer 170 are selected, at least in part, to achieve a differential etch rate between the two layers, so that the sacrificial layer 170 can be easily removed in the region of the Schottky contact 132 after ohmic metal patterning, preferably without a dry etch. A suitable combination of materials is LPCVD silicon nitride for the passivation layer 160 and PECVD silicon nitride for the sacrificial layer 170. Since PECVD and LPCVD silicon nitride have quite different wet etch rates, for example, the PECVD silicon nitride sacrificial layer 170 can be selectively removed from the LPCVD silicon nitride passivation layer 160. The wet etch rate of PECVD silicon nitride in Buffered Oxide Etch (BOE) for example can be up to 60 nanometres per minute while that of LPCVD silicon nitride is less than 2 nanometres per minute. The difference in etch rate is largely due to the difference in density between the two materials. The differences in the structures of PECVD silicon nitride and LPCVD silicon nitride also enable the two layers to be distinguished by techniques such as SEM and TEM.

Figure 3:
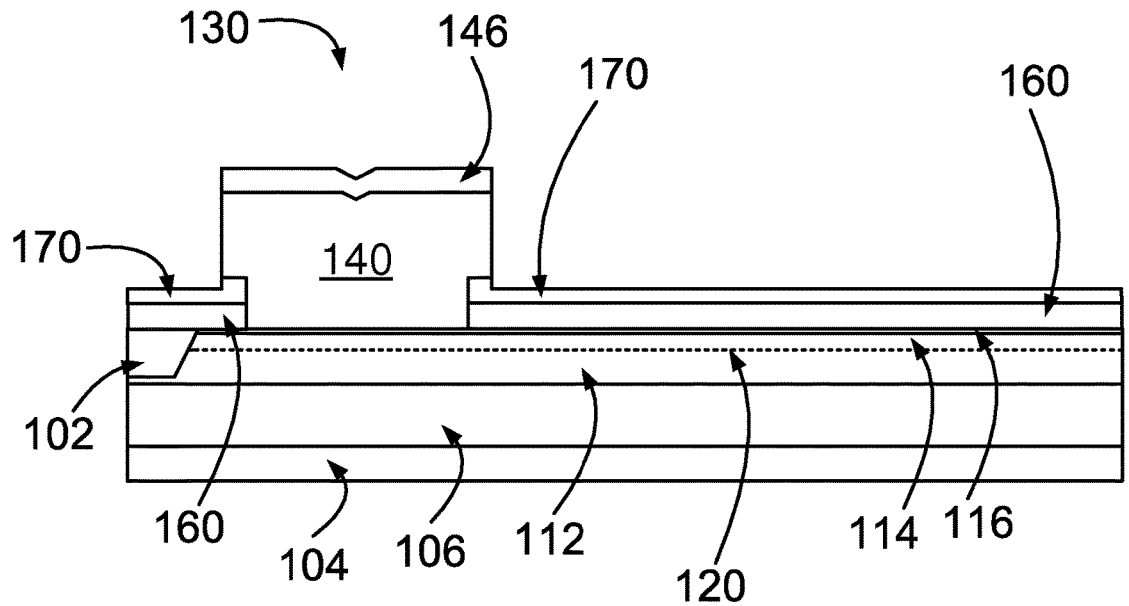
FIG. 3 shows an aspect of a method according to an embodiment of the present invention.

FIG. 3 shows the semiconductor device 100 at an intermediate stage of the fabrication process, directly after formation of the ohmic contact 130 and removal of the photoresist layer. For simplicity, only a portion of the device 100 is shown, including the regions occupied by the ohmic source contact 130 and Schottky gate contact 132. To form the ohmic contact 130, a window is etched through the passivation layer 160 and sacrificial layer 170 using a dry etch process. Metallization is applied via sputter deposition of Ti/Al/TiW(N), where TiW(N) indicates the TiW/TiWN/TiW contact capping layer 146. The metal stack is patterned through a dry etch involving a plasma etch that removes all metal from the sacrificial layer 170 outside of the ohmic contact 130. In the case of a HEMT 100, which comprises two ohmic contacts 130, 134 as shown in FIG. 2, both ohmic contacts 130, 134 are formed using the same process at the same time.

The dry etch process used to remove the metal from outside of the ohmic contacts 130, 134 is optimized to have a good selectivity to the material of the sacrificial layer 170, but over-etching is still applied to ensure that all the metal is removed. This dry etch sequence causes a part of the sacrificial layer 170 to be consumed, typically 15-20 nanometres. However, the critical passivation layer 160 is largely unaffected since it is protected by the sacrificial layer 170. The sacrificial layer 170 serves the purpose of an etch stop layer.

Figure 4:
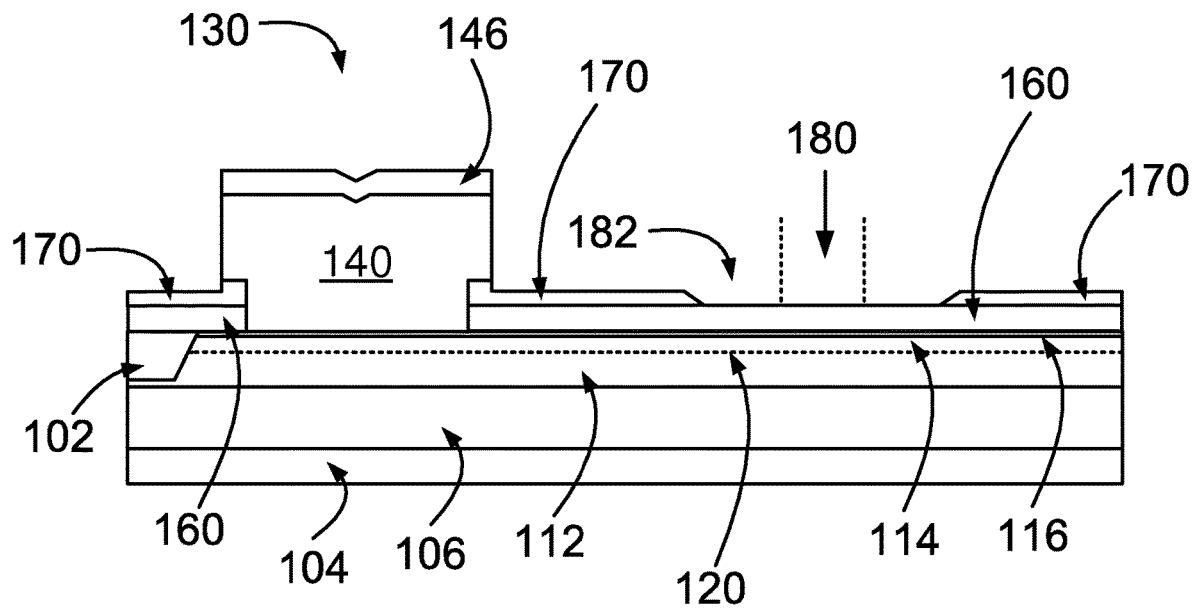
FIG. 4 shows another aspect of a method according to an embodiment of the present invention.

FIG. 4 shows a later stage of the manufacturing process, during formation of the Schottky contact 132, directly after formation of an opening 182 in the sacrificial layer 170 by a wet etch process and removal of the photoresist. The opening 182 in the sacrificial layer 170 is etched using a wet etch process using a reticle (known as the gate foot mask) which exposes the area 180 between the dashed lines in FIGS. 2 and 4. This is the same reticle as that used for the gate foot etch in the device shown in FIG. 1. The mask ensures that the metals of the ohmic contacts 130, 134 are not exposed to the wet etch chemistry.

Wet etching of a PECVD silicon nitride sacrificial layer 170 on top of an LPCVD silicon nitride passivation layer 160 using Buffered Oxide Etch (BOE) has been verified experimentally. Typically a large under-etch is seen in the sacrificial layer 170, which is illustrated by the fact that the wet-etched window 182 in the sacrificial layer 170 is larger than the area 180 exposed by the gate foot mask. Typically, the slope of the edges of the wet-etched opening in the PECVD silicon nitride of the sacrificial layer 170 is very small. Cross-section SEM (scanning electron microscopy) has shown that the angle of the slope is close to 15°. In this implementation, this is very useful because the silicon nitride thickness under the gate metal, around the gate foot, largely determines the electrical field shape and therefore the reverse Schottky gate leakage current.

Next, an opening is formed in the passivation layer 160 using the same gate foot mask 180 with a fluorine-based (e.g. $SF_6$- or $CF_4$-based) dry etch chemistry. After deposition of the Schottky metal, the Schottky contact 132 is patterned using a dry etch process. Again, the sacrificial layer 170 serves as a buffer so that the passivation layer 160 is not exposed to the dry etch.

The thickness of the sacrificial layer 170 is preferably tuned to match the maximum consumption of both ohmic and Schottky metal etch processes. The thinner the sacrificial layer 170, the better, since this minimizes the wet etch time for etching through the sacrificial layer 170. This also causes a minimal impact on the design of the gate foot and gate head.

The thickness of the sacrificial layer 170 may be between 50 nm and 100 nm prior to patterning of the contacts 130, 132, 134. This thickness is determined largely by the fact that the etching sequences for the ohmic contacts 130, 134 and the Schottky contact 132 typically each consume around 15-20 nm of the PECVD silicon nitride of the sacrificial layer 170, giving a total loss of around 40 nm. It follows that the thickness of the sacrificial layer 170 under the edge portion 152 of the ohmic contacts 130, 134 is around 50-100 nm, while the thickness of the sacrificial layer 170 under the edge portion 152 of the Schottky contact 132 up to around 80 nm, depending on how much of the sacrificial layer 170 is removed during patterning of the ohmic contacts 130, 132.

In this embodiment, the thickness of the passivation layer 160 may be between 20 nm and 30 nm prior to patterning of the contacts 130, 132, 134. The present invention enables a reduced thickness for the passivation layer 160, compared with the minimum thickness of around 50 nm used in the device 1 of FIG. 1, since the passivation layer 160 is protected by the sacrificial layer 170 during the etch processes.

The skilled person will appreciate that different materials may be used for the passivation layer 160 and sacrificial layer 170. For example, the passivation layer 160 may comprise PECVD silicon nitride or LPCVD silicon nitride, and the sacrificial layer 170 may comprise PECVD silicon oxide. These materials also have sufficient difference in etch rate such that the sacrificial layer 170 may be selectively removed from the passivation layer 160. The difference in etch rate is also due to differences in density and other parameters such as refractive index and breakdown stress. A further alternative is to use TEOS (tetraethylorthosilicate) for the sacrificial layer 170, which can also be removed in a straightforward manner from a passivation layer 160 comprising LPCVD silicon nitride.

As a further example, both the passivation layer 160 and the sacrificial layer 170 may comprise two differently-deposited silicon oxides. For example, the sacrificial layer 170 may comprise TEOS (tetraethylorthosilicate) or HDP (high density plasma) silicon oxide. These may be used in combination with a passivation layer 160 comprising, for example, PECVD silicon oxide. Both TEOS and HDP silicon oxide have a lower etch rate in HF-solutions than PECVD silicon oxide, enabling them to be selectively removed.

As can be seen in FIG. 2, a portion of the sacrificial layer 170 remains below the edge portions 152 of the ohmic contacts 130, 134 and the Schottky contact 132. This may be detected in the finished semiconductor device 100 by cross-section SEM (scanning electron microscopy) and TEM (transmission electron microscopy), and/or by a selective etch process to detect a difference between the passivation layer 160 and sacrificial layer 170.

The presence of the sacrificial layer 170 protects the passivation layer 160 during dry etching of the ohmic contacts 130, 132, preventing the passivation layer 160 from being exposed to the dry etch. This avoids plasma-induced carrier injection in the passivation layer 160 and is therefore advantageous in producing semiconductor devices having good performance, particularly under dynamic conditions.

Since the sacrificial layer 170 is selectively removable from the passivation layer 160, the thickness of the passivation layer 160 around the gate foot where the Schottky contact metal 142 is in electrical contact with the AlGaN layer 114, is well defined. The thickness of the passivation layer 160 in this region is critical in defining the reverse leakage current of the semiconductor device 100. The use of the sacrificial layer 170 therefore improves uniformity of this thickness across a wafer, reducing process spread.

In addition, the sacrificial layer 170 enables a further reduction of the passivation layer thickness, specifically underneath the Schottky metal 142 which further reduces the reverse leakage current of the device.

Although the present embodiment has been described with reference to a HEMT, as shown in FIG. 2, the process may also be used to produce a Schottky barrier diode.

Figure 5:
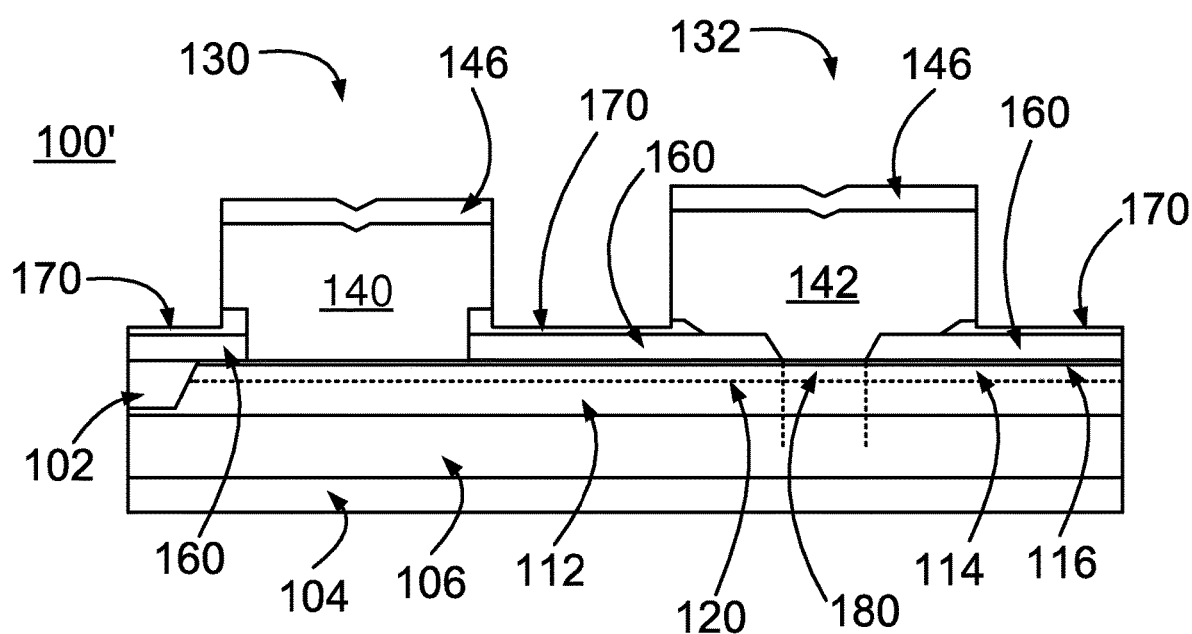
FIG. 5 shows a Schottky barrier diode according to another embodiment of the present invention.

FIG. 5 shows a further embodiment of the invention in the form of a Schottky diode 100'. Elements shown in FIG. 5 which correspond to elements described above with reference to FIG. 2 are indicated by the same reference numbers. The Schottky diode 100' comprises an ohmic contact 130 and a Schottky contact 132. The ohmic contact 130 comprises the cathode, and the Schottky contact 132 comprises the anode.

Optionally, the sacrificial layer 170 may be removed to a greater extent or completely after formation of the ohmic contacts 130, 134 or the Schottky contact 132, for example by a wet etch process. This may be carried out, for example, during patterning of the ohmic contacts 130, 132, or Schottky contact 134, by performing an over-etch to ensure complete removal of metallization outside of the contacts 130, 132, 134.

Figure 6:
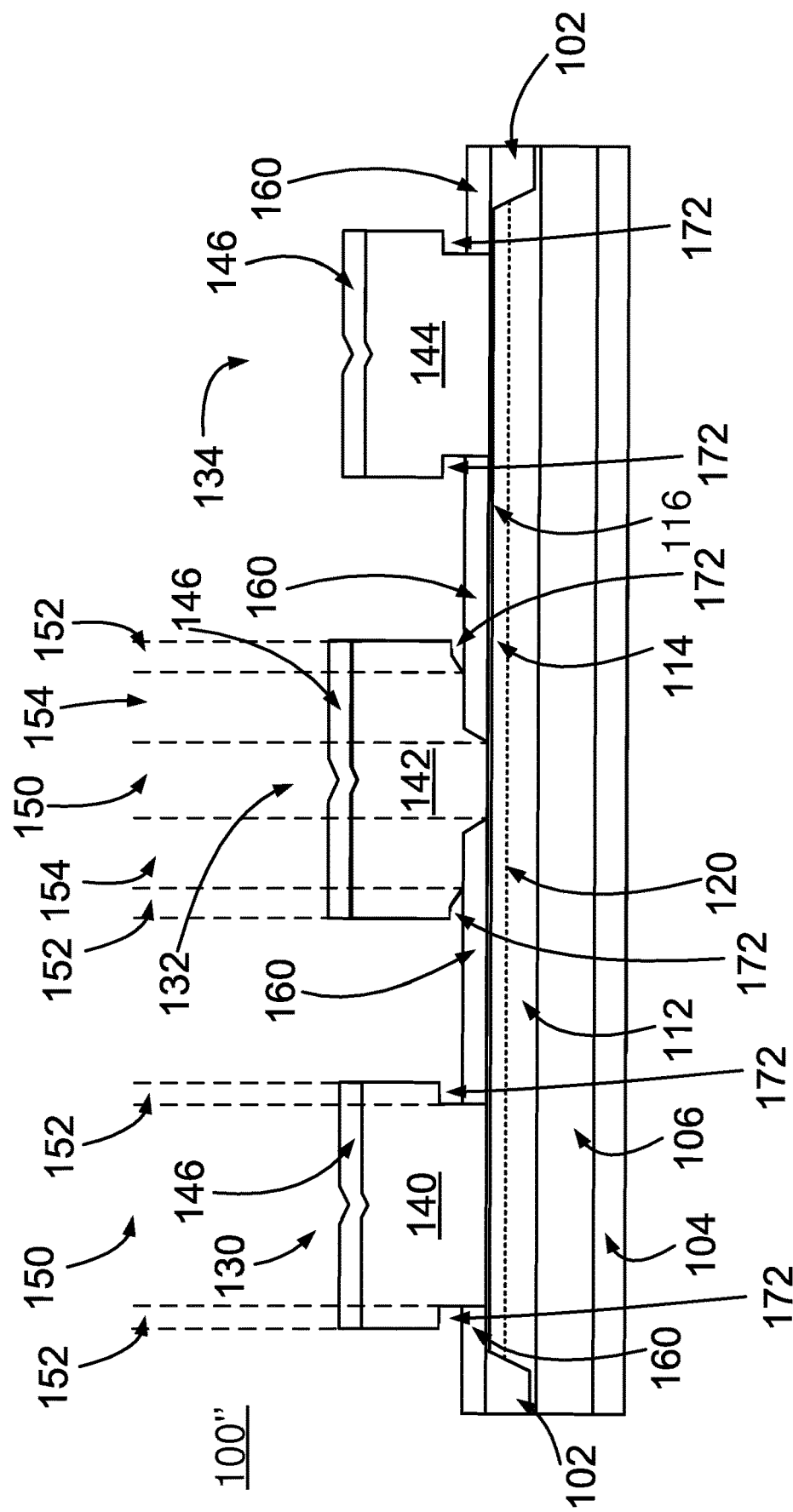
FIG. 6 shows a High Electron Mobility Transistor (HEMT) according to a further embodiment of the invention.

In this way, the portion of the sacrificial layer between the passivation layer 160 and the edge portion 152 of the ohmic contacts 130, 134 and/or the portion of the sacrificial layer 170 between the passivation layer 160 and the Schottky contact 132, may be partially or completely removed. In this case, an air gap 172 may remain between the edge portion of the contact 130, 132, 134 and the passivation layer 160. This is illustrated by FIG. 6, which shows a semiconductor device 100", in the form of a HEMT, according to a further embodiment of the invention. Elements shown in FIG. 6 which correspond to elements described above with reference to FIG. 2 are indicated by the same reference numbers. In the HEMT 100" shown in FIG. 6, the sacrificial layer has been removed after formation of the Schottky contact 132 to leave an air gap 172 between the edge portion 152 of each contact 130, 132, 134 and the upper surface of the passivation layer 160. Usefully, the air gap 172 is a good insulator.

The air gaps 172 may be reduced in size by partially filling this gap. However, artefacts relating to the use of the sacrificial layer 170 during the process of manufacture would remain detectable after completion of the semiconductor device 100.

It will be appreciated by persons skilled in the art that the above embodiments have been described by way of example only, and not in any limitative sense, and that various alterations and modifications are possible without departure from the scope of the invention as defined by the appended claims.

The invention claimed is:

1. A semiconductor device, comprising:
   a substrate;
   a GaN layer;
   an AlGaN layer, wherein the GaN layer is located between the substrate and said AlGaN layer;
   at least one contact comprising
      a central portion having a bottom surface in contact with a capping layer formed on said AlGaN layer,
      an edge portion having a bottom surface, and
      an intermediate portion having a bottom surface, the entire intermediate portion being between said central portion and said edge portion; and
   a passivation layer located at least between said edge portion of said contact and said AlGaN layer,
   wherein said passivation layer is not in contact with the entire bottom surface of said edge portion, and wherein said entire bottom surface of the edge portion is spaced apart by an air gap from an upper surface of said passivation layer,
   wherein said upper surface of said passivation layer is in contact with the entire bottom surface of said intermediate portion of said contact, and wherein the entire bottom surface of said intermediate portion in contact with said upper surface of said passivation layer is substantially planar and is larger than the entire bottom surface of said edge portion spaced apart from said passivation layer.

2. A semiconductor device of claim 1, wherein between said upper surface of said passivation layer and said edge portion of said contact, said air gap comprises a separation that decreases towards said intermediate portion.

3. A semiconductor device of claim 1, wherein said passivation layer has a thickness of less than 50 nanometers.

4. A semiconductor device of claim 1, wherein said passivation layer comprises an opening for electrical contact of said central portion of said contact with said AlGaN layer.

5. A semiconductor device of claim 1, wherein the capping layer is between said AlGaN layer and said passivation layer.

6. A semiconductor device of claim 1, further comprising a High Electron Mobility Transistor (HEMT) having a source, a gate and a drain, wherein said contact comprises one of said source, said gate and said drain.

7. A semiconductor device, comprising:
   a substrate;
   a GaN layer;
   an AlGaN layer, wherein the GaN layer is located between the substrate and the AlGaN layer;
   at least one contact comprising
      a central portion having a bottom surface in contact with a capping layer of the AlGaN layer;
      an edge portion having a bottom surface, and
      an intermediate portion, the entire intermediate portion being between the central portion and the edge portion;

a passivation layer located at least between the edge portion of the contact and the AlGaN layer and having an upper surface; and a sacrificial layer formed of a material having a different density and etch rate than another material forming the passivation layer and having a gap forming portion, wherein the passivation layer does not contact the entire bottom surface of the edge portion, and wherein the entire bottom surface of the edge portion is spaced apart from the upper surface of the passivation layer by the gap forming portion of the sacrificial layer, wherein the entire bottom surface of the intermediate portion substantially planar and is larger than the entire bottom surface of the edge portion spaced apart from the upper surface of the passivation layer, and wherein the upper surface of the passivation layer is in contact with the intermediate portion of the contact and the sacrificial layer is spaced apart from the central portion by the intermediate portion.

8. A semiconductor device of claim 7, wherein:

said passivation layer comprises silicon nitride, and said sacrificial layer comprises silicon nitride having a different proportion of silicon than said passivation layer.

9. A semiconductor device of claim 7, wherein said passivation layer comprises LPCVD silicon nitride and said sacrificial layer comprises PECVD silicon nitride.

10. A semiconductor device of claim 7, wherein said passivation layer comprises silicon nitride and said sacrificial layer comprises PECVD silicon oxide.

11. A semiconductor device of claim 7, further comprising a Schottky barrier diode having an anode and a cathode, wherein said contact comprises one of said anode and said cathode.

12. The semiconductor device of claim 7, wherein the passivation layer and the sacrificial layer are formed of silicon nitride having the different etch rates.

13. The semiconductor device of claim 7, wherein the semiconductor device includes a high mobility electron transistor (HEMT) and further includes:

a source contact, a drain contact, and a Schottky contact of the HEMT, wherein each of the source contact, the drain contact, and the Schottky contact include a central portion and an edge portion, the edge portion being spaced apart from the upper surface of the passivation layer by the sacrificial layer; and wherein the Schottky contact further includes an intermediate portion, the entire intermediate portion being between the central portion and the edge portion, and wherein the upper surface of the passivation layer is in contact with a bottom surface of the intermediate portion of the contact and the sacrificial layer is spaced apart from the central portion by the intermediate portion.

14. The semiconductor device of claim 7, wherein the sacrificial layer includes a slope with an angle of 15 degrees, the slope being in contact with the edge portion.

15. A semiconductor device, comprising:

a substrate;

a GaN layer;

an AlGaN layer, wherein the GaN layer is located between the substrate and said AlGaN layer;

at least one contact comprising:

a central portion having a bottom surface in contact with a capping layer formed on the AlGaN layer;

an edge portion having a bottom surface; and an intermediate portion having a bottom surface, the entire intermediate portion being between said central portion and said edge portion; and a passivation layer located at least between said edge portion of said contact and the AlGaN layer, wherein said passivation layer has an upper surface that is in contact with the entire bottom surface of said intermediate portion of said contact, wherein said edge portion is the portion of said contact beside said intermediate portion starting where the bottom surface of said edge portion is not in contact with said passivation layer and extending to the edge of said contact, and the entire bottom surface of said edge portion is not in contact with said passivation layer and is spaced apart by an air gap from an upper surface of said passivation layer, and wherein the entire bottom surface of said intermediate portion in contact with said upper surface of said passivation layer is substantially planar and is larger than the entire bottom surface of said edge portion spaced apart by the air gap from said passivation layer.

* * * * *